(12) United States Patent
Poddar et al.

(10) Patent No.: US 12,021,019 B2
(45) Date of Patent: Jun. 25, 2024

(54) SEMICONDUCTOR DEVICE PACKAGE WITH THERMAL PAD

(71) Applicant: Texas Instruments Incorporated, Dallas, TX (US)

(72) Inventors: Anindya Poddar, Sunnyvale, CA (US); Ashok Surendra Prabhu, San Jose, CA (US); Edgar Dorotyao Balidoy, Virac (PH); Hau Nguyen, San Jose, CA (US); Makoto Yoshino, Beppu (JP); Ming Li, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 197 days.

(21) Appl. No.: 17/515,176

(22) Filed: Oct. 29, 2021

(65) Prior Publication Data
US 2023/0136784 A1    May 4, 2023

(51) Int. Cl.
| | |
|---|---|
| H01L 23/498 | (2006.01) |
| H01L 21/48 | (2006.01) |
| H01L 21/56 | (2006.01) |
| H01L 23/00 | (2006.01) |
| H05K 1/02 | (2006.01) |

(52) U.S. Cl.
CPC .... *H01L 23/49861* (2013.01); *H01L 21/4839* (2013.01); *H01L 21/565* (2013.01); *H01L 23/49844* (2013.01); *H01L 24/48* (2013.01); *H05K 1/0204* (2013.01); *H01L 2224/48177* (2013.01); *H01L 2224/48178* (2013.01); *H01L 2224/48248* (2013.01);

(Continued)

(58) Field of Classification Search
CPC ......... H01L 23/49861; H01L 23/49844; H01L 21/4839; H01L 21/565; H01L 24/48
See application file for complete search history.

(56) References Cited

U.S. PATENT DOCUMENTS

| | | |
|---|---|---|
| 6,784,022 B2 | 8/2004 | Umehara et al. |
| 7,956,456 B2 | 6/2011 | Gurrum et al. |

(Continued)

OTHER PUBLICATIONS

Buschbom et. al. "PowerPAD—A Method to Create Thermally Enhanced Plastic Package Solutions for Semiconductors", SMI Conferenec, San Jose California, Aug. 25, 1998; retrieved from the url: https://www.ti.com/lit/an/snoa921/snoa921.pdf?ts=1635544557563 &ref_url=https%253A%252F%252Fwww.google.com%252F on Oct. 29, 2021.

(Continued)

*Primary Examiner* — Marc Anthony Armand
(74) *Attorney, Agent, or Firm* — Dawn Jos; Frank D. Cimino

(57) ABSTRACT

A described example includes: a package substrate having a die pad with a die side surface and having an opposite backside surface, having leads arranged along two opposite sides and having die pad straps extending from two opposing ends of the die pad. The leads lie in a first plane, a portion of the die pad straps lie in a second plane that is spaced from the first plane and located closer to the die pad, and the die pad lies in a third plane that is spaced from and parallel to the second plane in a direction away from the first plane. A semiconductor die is mounted to the die side surface and mold compound covers the semiconductor die, a portion of the leads, and the die side surface of the die pad, and the backside surface of the die pad exposed from the mold compound.

20 Claims, 11 Drawing Sheets

(52) U.S. Cl.
CPC ............... *H01L 2224/48465* (2013.01); *H01L 2924/1811* (2013.01); *H01L 2924/182* (2013.01)

(56) References Cited

U.S. PATENT DOCUMENTS

| | | | |
|---|---|---|---|
| 2015/0206830 A1* | 7/2015 | Takada | H01L 21/561 257/676 |
| 2022/0093494 A1* | 3/2022 | Huang | H01L 23/49568 |
| 2023/0014718 A1* | 1/2023 | Tuncer | H01L 21/565 |

OTHER PUBLICATIONS

Application Note,"Guidelines for ST's MOSFET SMD Packages", AN-1703, ST Microelectronics, Jun. 2003; retrieved from the url: https://www.google.com/url?sa=t&rct=j&q=&esrc=s&source=web&cd=&cad=rja&uact=8&ved=2ahUKEwip7P_Ez_DzAhX3IGoFHZUGBM4QFnoECAIQAQ&url=https%3A%2F%2Fwww.st.com%2Fresource%2Fen%2Fapplication_note%2Fcd00004438-guidelines-for-using-sts-mosfet-smd-packages-stmicroelectronics.pdf&usg=AOvVaw04h-srcdv9kPizaXcw1_fi on Oct. 29, 2021.

* cited by examiner

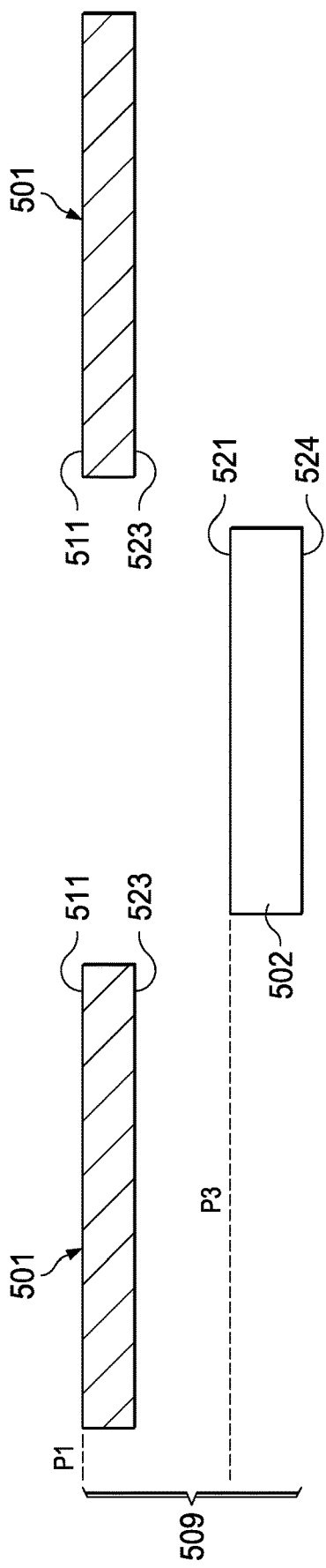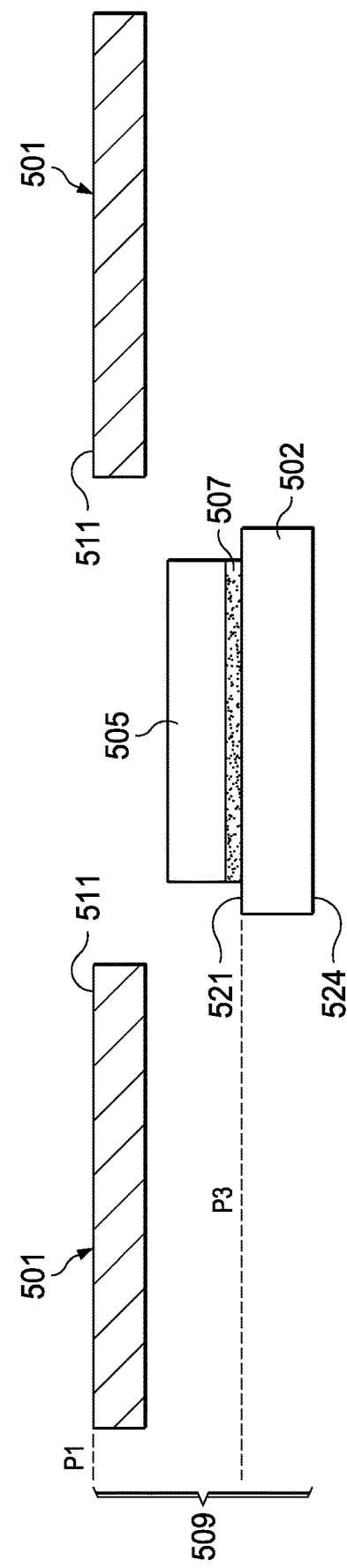

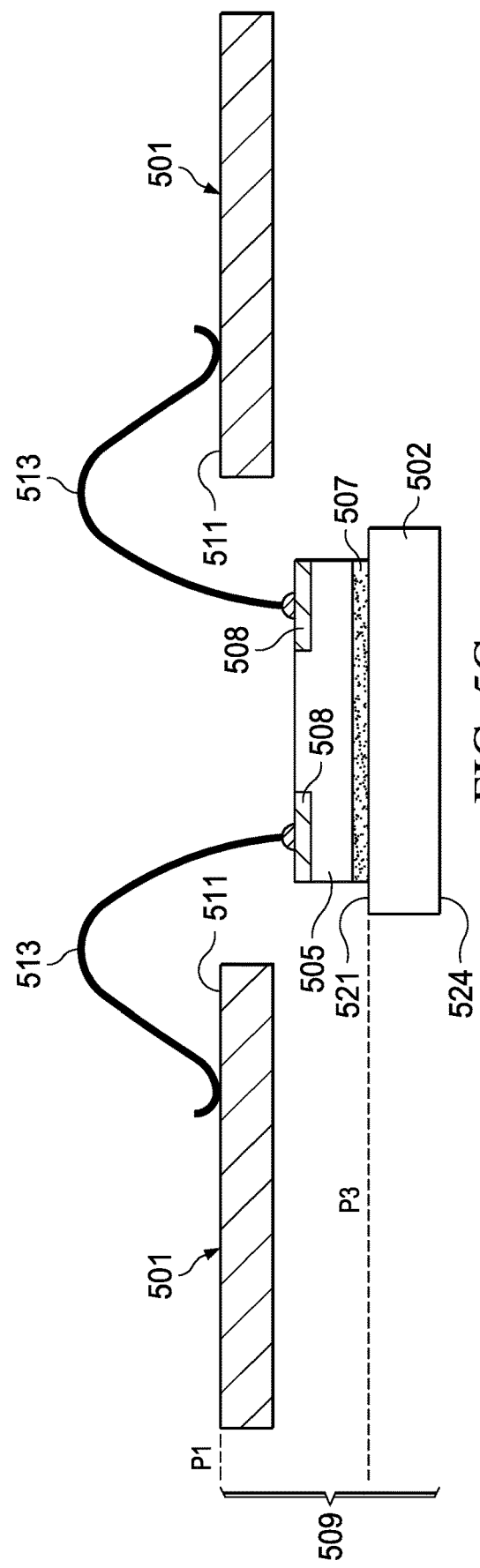

SEMICONDUCTOR DEVICE PACKAGE WITH THERMAL PAD

TECHNICAL FIELD

This relates generally to packaging electronic devices, and more particularly to semiconductor dies in molded semiconductor device packages.

BACKGROUND

Processes for producing semiconductor device packages include mounting a semiconductor die to a package substrate, and covering the electronic devices with mold compound to form packaged devices. The molding processes may be done on single devices, or may be done on multiple electronic devices simultaneously. The devices may be arranged on a package substrate in a strip of devices adjacent to one another, or in a two dimensional array of devices in rows and columns on a package substrate, such as lead frame strips or arrays. Once the molded packages are completed, the packaged semiconductor devices are separated from one another and from the package substrate. In one method to separate the devices from one another, a saw is used. The saw cuts through the mold compound and through the package substrate materials along saw streets defined between the semiconductor device packages, to separate the devices. Other cutting tools such as lasers can be used.

Small outline transistor (SOT) packages are used when a semiconductor device has a few terminals, such as a power transistor device, a sensor, or an analog device. Wire bonded semiconductor devices can be used to form an SOT package. In a wire bonded semiconductor device package, a semiconductor die is attached to a package substrate, such as a lead frame. The semiconductor die has bond pads on a device side surface for electrical connections. Bond wires or ribbon bonds are formed to electrically connect the bond pads on the device side surface of the semiconductor die to leads on the package substrate. In an example using a lead frame as a package substrate, an electrical connection is formed using a bond wire bonded to a lead on the lead frame.

In an example application, when the semiconductor devices are power transistors which deliver power in the form of current or voltages to a load, heat is generated when operating the semiconductor device. In a molded semiconductor device package, the semiconductor die or dies can be isolated from a circuit board by the mold compound, and by ambient atmosphere between the packaged device and a system board, so that the heat from the semiconductor die is inefficiently transferred from the semiconductor devices.

SUMMARY

In a described example, an apparatus includes a package substrate having a die pad with a die side surface for receiving a semiconductor die and having an opposite backside surface, the package substrate having leads spaced from the die pad arranged along two opposite sides of the die pad, and having die pad straps extending from two opposing ends of the die pad, the leads lying in a first plane, a portion of the die pad straps lying in a second plane that is spaced from and parallel to the first plane and located closer to the die pad than the first plane, and the die pad straps having angled portions extending to the die pad that lies in a third plane that is spaced from and parallel to the second plane in a direction away from the first plane. A semiconductor die is mounted to the die side surface of the die pad, the semiconductor die having bond pads on a device side surface facing away from the die pad; electrical connections couple the bond pads of the semiconductor die to the leads of the package substrate; and mold compound covers the semiconductor die, the electrical connections, a portion of the leads, and the die side surface of the die pad, and the backside surface of the die pad exposed from the mold compound.

BRIEF DESCRIPTION OF THE DRAWINGS

FIGS. 5A-5F illustrate, in a series of cross sectional views and projection views, the major steps in manufacturing a packaged semiconductor device of the arrangements.

DETAILED DESCRIPTION

Figure 1:
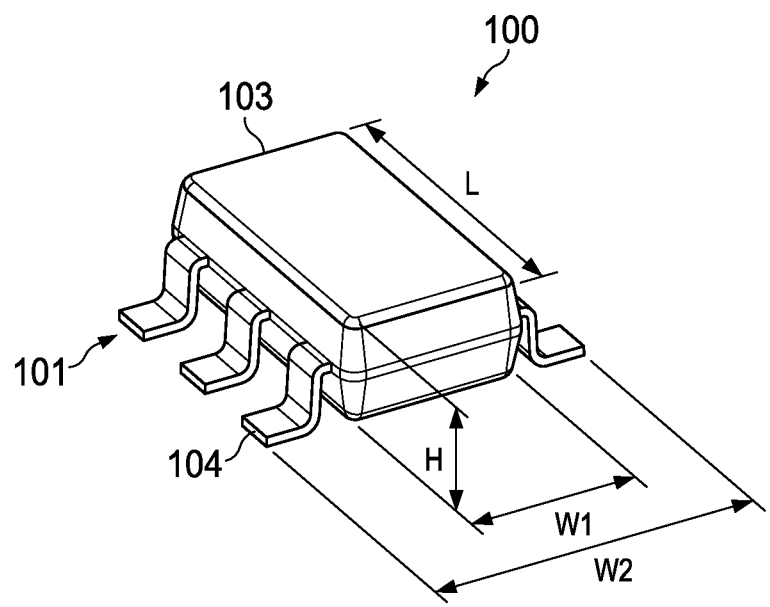
FIG. 1 illustrates in a projection view a small outline transistor (SOT) package.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. A semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, sensors, or active devices such as transistors. The semiconductor die can be an integrated circuit with hundreds or thousands of transistors coupled to form a functional circuit, for example a microprocessor or memory device.

The term "semiconductor device package" is used herein. A semiconductor device package has at least one semiconductor die electrically coupled to terminals, and has a package body that protects and covers the semiconductor die. In some arrangements, multiple semiconductor dies can be packaged together. For example, a power metal oxide semiconductor (MOS) field effect transistor (FET) semiconductor die and a logic semiconductor die (such as a gate driver die or a controller die) can be packaged together to from a single packaged electronic device. Additional components such as passives can be included in the packaged electronic device. The semiconductor die is mounted to a package substrate that provides conductive leads, a portion of the conductive leads form the terminals for the packaged device. The semiconductor die can be mounted to the package substrate with a device side surface facing away from the substrate and a backside surface facing and mounted to a die pad of the package substrate. In wire bonded semiconductor device packages, bond wires couple conductive leads of a package substrate to bond pads on the semiconductor die. The semiconductor device package can have a package body formed by a thermoset epoxy resin in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions provide the terminals for the semiconductor device package.

The term "package substrate" is used herein. A package substrate is a substrate arranged to receive a semiconductor die and to support the semiconductor die in a completed semiconductor device package. Package substrates useful with the arrangements include conductive lead frames, which can be formed from copper, aluminum, stainless steel, steel and alloys such as Alloy 42 and copper alloys. The lead frames can include a die pad with a die side surface for mounting a semiconductor die, and conductive leads arranged near and spaced from the die pad for coupling to bond pads on the semiconductor die using wire bonds, ribbon bonds, or other conductors. The lead frames can be provided in strips or arrays. The conductive lead frames can be provided as a panel with strips or arrays of unit device portions in rows and columns. Semiconductor dies can be placed on respective unit device portions within the strips or arrays. A semiconductor die can be placed on a die pad for each packaged device, and die attach or die adhesive can be used to mount the semiconductor dies to the lead frame die pads. In wire bonded packages, bond wires can couple bond pads on the semiconductor dies to the leads of the lead frames. The lead frames may have plated portions in areas designated for wire bonding, for example silver plating can be used. After the bond wires are in place, a portion of the package substrate, the semiconductor die, and at least a portion of the die pad can be covered with a protective material such as a mold compound.

A package substrate, such as a lead frame, will have conductive portions on a die side surface. Leads of a metal lead frame are conductive all along the surfaces, while for other substrate types, conductive lands in dielectric substrate material are arranged for connecting to the semiconductor die. Platings to enhance bond wire adhesion, prevent corrosion and tarnish, and increase reliability can be used on leads of conductive lead frames. Spot plating or overall plating can be used.

In packaging semiconductor devices, mold compound may be used to partially cover a package substrate, to cover the semiconductor die, and to cover the electrical connections from the semiconductor die to the package substrate. This can be referred to as an "encapsulation" process, although some portions of the package substrates are not covered in the mold compound during encapsulation, for example terminals and leads are exposed from the mold compound. Encapsulation is often a compressive molding process, where thermoset mold compound such as resin epoxy can be used. A room temperature solid or powder mold compound can be heated to a liquid state and then molding can be performed by pressing the liquid mold compound into a mold. Transfer molding can be used. Unit molds shaped to surround an individual device may be used, or block molding may be used, to form the packages simultaneously for several devices from mold compound. The devices can be provided in an array of several, hundreds or even thousands of devices in rows and columns that are molded together.

After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and the saw will traverse the molded electronic devices in two different directions to cut apart the packaged electronic devices from one another in the array.

The term "quad flat no-lead" or "QFN" is used herein for a type of electronic device package. A QFN package has conductive leads that are coextensive with the sides of a molded package body, and in a quad package the leads are on four sides. Alternative flat no-lead packages may have leads on two sides or only on one side. These can be referred to as "small outline no-lead" or "SON" packages. No-lead packaged electronic devices can be surface mounted to a board. Leaded packages can be used with the arrangements where the leads extend away from the package body and are shaped to form a portion for soldering to a board. A dual in line package (DIP) can be used with the arrangements. A small outline package (SOP) can be used with the arrangements. Small outline no-lead (SON) packages can be used, and a small outline transistor (SOT) package is a leaded package that can be used with the arrangements. Leads for leaded packages are arranged for solder mounting to a board. The leads can be shaped to extend towards the board, and form a mounting surface. Gull wing leads, J-leads, and other lead shapes can be used. In a DIP package, the leads end in pin shaped portions that can be inserted into conductive holes formed in a circuit board, and solder is used to couple the leads to the conductors within the holes.

Elements are described herein as "lying in a plane". A plane is a flat surface for which any two points lying in that same plane will lie. Elements lying in a plane will be in the same plane, however, in manufacturing some elements may be displaced from an intended location or may have irregular surfaces and may not be perfectly aligned with other elements intended to be in the same plane, as used herein, elements intended to lie in a plane are elements are lying in that plane. Certain planes are described herein as parallel to one another. As used herein, two planes are parallel when, if one plane is oriented in a horizontal position, the planes parallel to that plane are also in a horizontal position, and lines extending in two different parallel planes will never intersect one another. In manufacturing, elements intended to line in parallel planes may become displaced slightly due to manufacturing tolerances or process conditions, or may have irregular surfaces, as used herein elements intended to lie in parallel planes lie in parallel planes.

In the arrangements, a semiconductor device package includes a semiconductor die mounted to a package substrate. The package substrate can be a conductive lead frame. In an example arrangement, the package substrate is a dual downset lead frame. The package substrate has a die pad for mounting a semiconductor die in a deep downset. The backside surface of the semiconductor die is attached to the die pad, the device side surface of the semiconductor die facing away from the die pad and away from a backside surface of the die pad. The die pad has angled die pad straps formed as a downset feature that extend away from the board side surface of the package. Ends of the die straps can be exposed from the mold compound that forms the package body. The ends of the die straps are exposed from the mold compound that forms the package body because the die straps are part of a dual downset feature of the lead frame, part of which is outside the molded package body when the package body is formed, and these parts are trimmed away from the semiconductor device package after molding. Electrical connections are made between bond pads on a device side surface of the semiconductor die and leads on the package substrate. The electrical connections can be bond wires, or ribbon bonds. The semiconductor die, the electrical connections, and portions of the package substrate are encapsulated in mold compound to form a packaged device. The die pad has a backside surface that is exposed from the mold compound on the board side or "bottom" surface of the semiconductor device package. When the semiconductor device package is mounted to a circuit board, the exposed backside surface of the die pad can be soldered or placed in thermal contact to a thermal pad on the circuit board. This feature of the arrangements makes an efficient thermal transfer path from the semiconductor die. The die pad and the leads of the package can be soldered in a thermal reflow process to make electrical connections and mechanical connections to the circuit board.

FIG. 1 illustrates, in a projection view, a semiconductor device package 100, illustrated in a small outline transistor (SOT) package. SOT packages are one type of semiconductor device package that is useful with the arrangements. SOT packages are used for low terminal count devices including passive components, transistors, and analog circuits. The semiconductor device package 100 has a body formed from a mold compound 103, for example a thermoset epoxy resin. Other mold compounds can be used including resins, epoxies, or plastics. Leads 101 are part of a package substrate 109 (not visible in FIG. 1, see FIG. 2) that supports a semiconductor die 105 (not visible in FIG. 1, as it is obscured by the package body, see FIG. 2) within the package 100, the leads 101 are exposed from the mold compound 103 and form electrical terminals for the packaged electronic device. The leads 101 in FIG. 1 are formed to provide gull wing shaped terminals that extend alongside the body of the packaged semiconductor device 100 with a foot portion 104 at the ends. The packaged electronic device 100 can be mounted to a circuit board or module using surface mount technology (SMT). Sizes for packaged electronic devices are continually decreasing, and currently can be several millimeters on a side to less than one millimeter on a side, although larger and smaller sizes are also used. Future package sizes may be smaller. A JEDEC standard for a 6 terminal SOT package, as an example useful with the arrangements, is the SOT-23-6 package. An example of this package has a body with a length: L that is about 3 millimeters, and a body width W1 about 1.75 millimeters, and that the total package width W2 including the leads to the ends of the leads is about 3 millimeters. The package body in FIG. 1 has a height H of about 1.45 millimeters including the ends of the leads 101.

Figure 2:
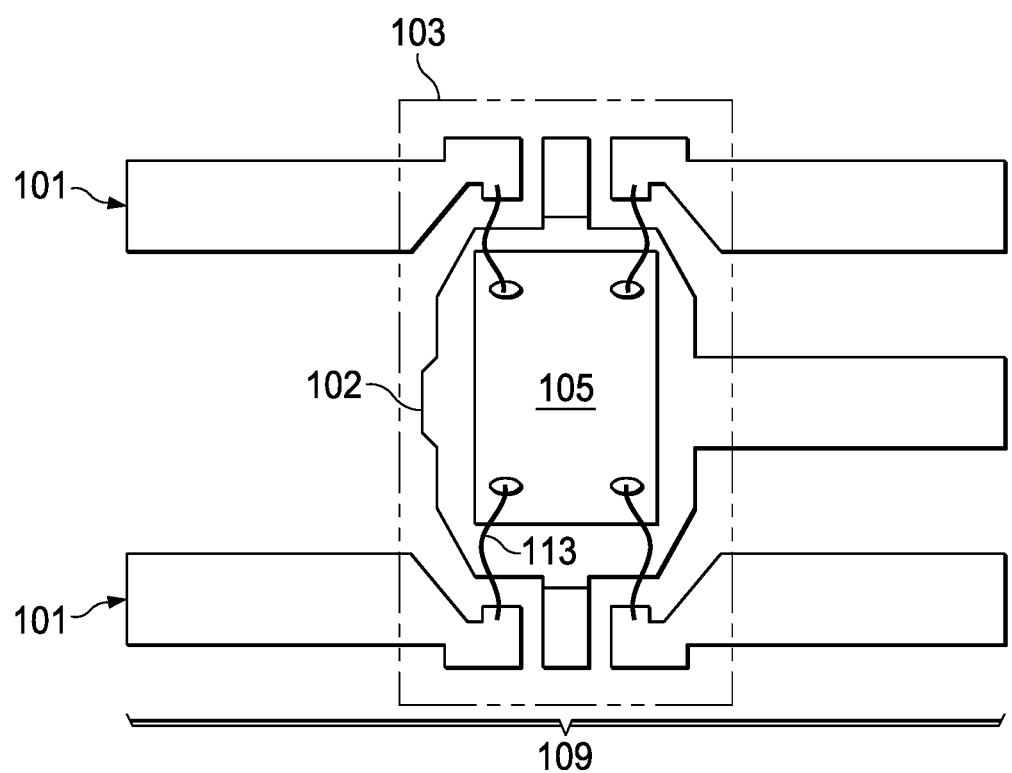
FIG. 2 illustrates, in a plan view, an SOT package.

FIG. 2 illustrates the semiconductor die 105 mounted to the package substrate 109, with wire bonds 113 formed to couple bond pads on semiconductor die 105 to leads 101, and with mold compound 103 formed and shown as transparent for clarity of illustration. FIG. 2 illustrates the elements after molding forms the mold compound 103 and after a trim step removes dam bars and unused leads from the package substrate 109, but prior to a form step to shape the leads 101. Semiconductor die 105 is mounted to a die mount portion 102 of a package substrate 109. The device side surface of the semiconductor die 105 is facing away from the package substrate 109. In this example the package substrate 109 is a metal lead frame. Portions of the lead frame form leads 101. The die 105 is coupled to the lead frame by bond wires 113. The bond wires 113 are formed in a wire bonding tool. Mold compound 103 (shown as a dashed line in this view for illustration) covers the semiconductor die 105, the bond wires 113, and portions of the package substrate 109, while leads 101 extend from the mold compound 103. The die pad 102 where the semiconductor die 105 is mounted is approximately rectangular, but as shown in FIG. 2 the corners can be chamfered, alternative shapes include oval, circular, or square shapes. The corners can be rounded, or sloped and additional shapes extending from the sides can add mechanical support to pad 102 by acting as mold compound locks, by increasing adhesion to the mold compound. The leads are arranged on either side of the die pad 102.

In wire bonding, a wire bonding tool includes a capillary with a bond wire running through it. In useful examples, the bond wire can be copper, palladium coated copper (PCC), gold, silver or aluminum. To begin a wire bond, a "free air" ball is formed on the end of the bond wire as it extend from the capillary by a flame or other heating device directed to the end of the wire. The ball is placed on a conductive bond pad of a semiconductor die and the ball is bonded to the bond pad. Heat, mechanical pressure, and/or sonic energy can be applied to bond the ball to the bond pad. As the capillary moves away from the ball bond on the bond pad, the bond wire extends from the capillary in an arc or curved shape. The capillary moves over a conductive portion of the package substrate, for example a spot on a lead of a lead frame. The capillary in the wire bonder is used to bond the bond wire to the conductive lead, for example a stitch bond can be formed. After the bond is formed to the conductive lead, the wire extending from the stitch bond is cut or broken at the capillary end, and the process starts again by forming another ball on the wire. Automated wire bonders can repeat this process very rapidly, many times per second, to form bond wires. This process is referred to as "ball and stitch" bonding. In an alternative, a ball is first bonded to a lead or other surface. A second ball is formed and bonded to a bond pad on the semiconductor die, and the bond wire is extended to the first ball, and bonded to the ball with a stitch on the ball, this is sometimes referred to as "ball stitch on ball" or "BSOB" bonding. In some example processes, the ball bonds are more reliable than stitch bonds, and the extra ball bonds increase the bond reliability.

Figure 3:
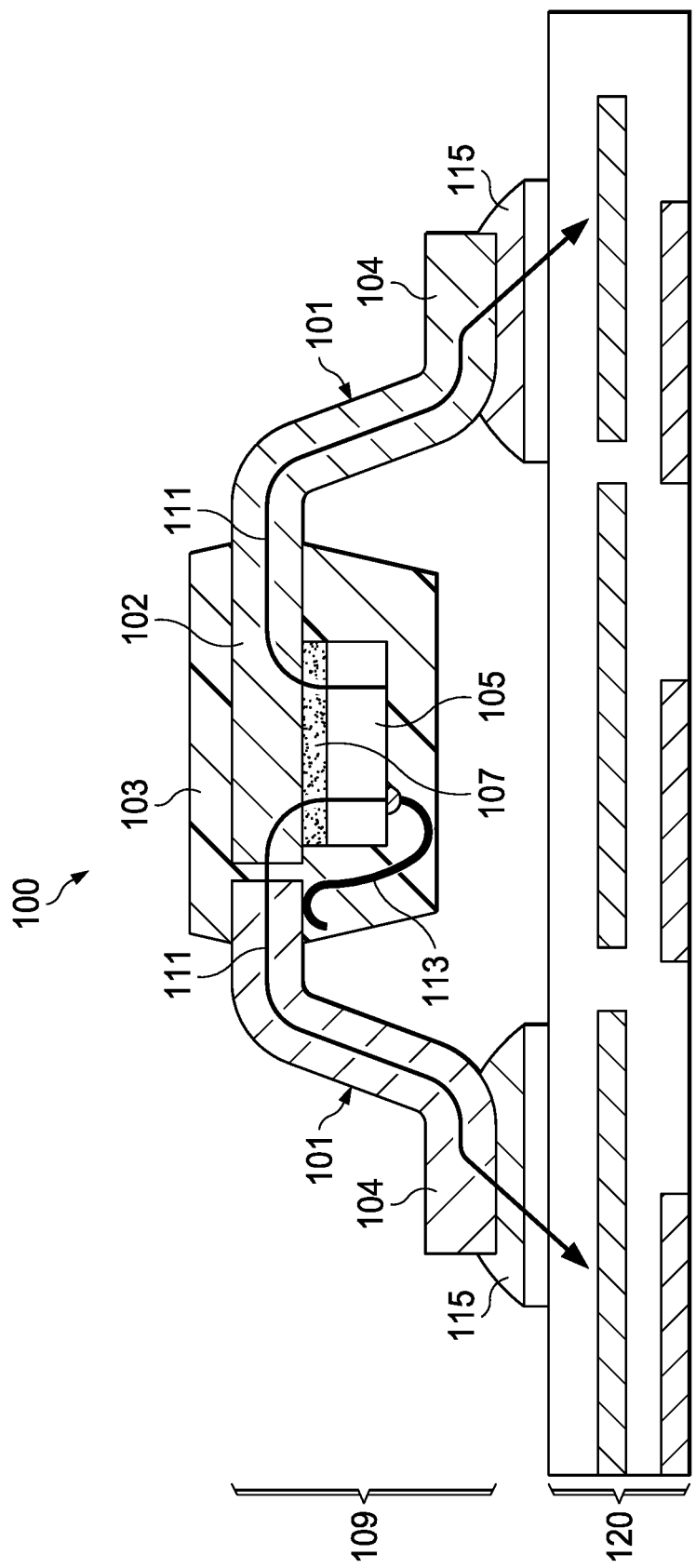
FIG. 3 illustrates, in a cross sectional view, an SOT package surface mounted to a circuit board.

FIG. 3 illustrates, in a cross sectional view, the packaged device 100 of FIGS. 1 and 2 mounted to a circuit board 120 by solder 115. In FIG. 3, the package is shown with the leads 101, the package body formed by mold compound 103, the package substrate 109, and the semiconductor die 105 which is mounted to the package substrate 109. In the arrangement of FIG. 3, the package substrate 109 is inverted after wire bonding so that the device side surface of the semiconductor die 105 faces the board side surface of package 100. Package substrate 109 has its backside surface facing upwards away from the board 120, so that as oriented in FIG. 3. the device side surface of semiconductor die 105 faces down towards the system board, and semiconductor die 105 has a backside surface facing upwards, away from the board side of the package 100. As shown in FIG. 3, the package 100 is surface mounted to a circuit board 120 using the foot portions 104 of the ends of the leads 101. The foot portions 104 are soldered to the circuit board 120. The circuit board 120 can be any circuit board material used to mount semiconductor devices. Laminate materials with conductor spaced by dielectric, and vias coupling the conductors, can be used, for example flame retardant 4 (FR4), BT resin, ceramic circuit board materials, flexible circuit board materials such as films, laminates, and tapes can be used for board 120. Additional devices (not shown) can be mounted to circuit board 120 and coupled to form a system or module.

In FIG. 3, arrows 135 illustrate the heat transfer paths from the semiconductor die 105 through the package substrate 109 and to the circuit board 120 using the leads 101. Heat transfer from the semiconductor die 105, through the die attach 107, the package substrate 109, through mold compound 103, and the leads 101 can be inefficient, as leads 101 are designed for carrying electrical signals and are not arranged for efficient heat dissipation. When a semiconductor die heats during operation, the performance can decrease.

Figure 4A:
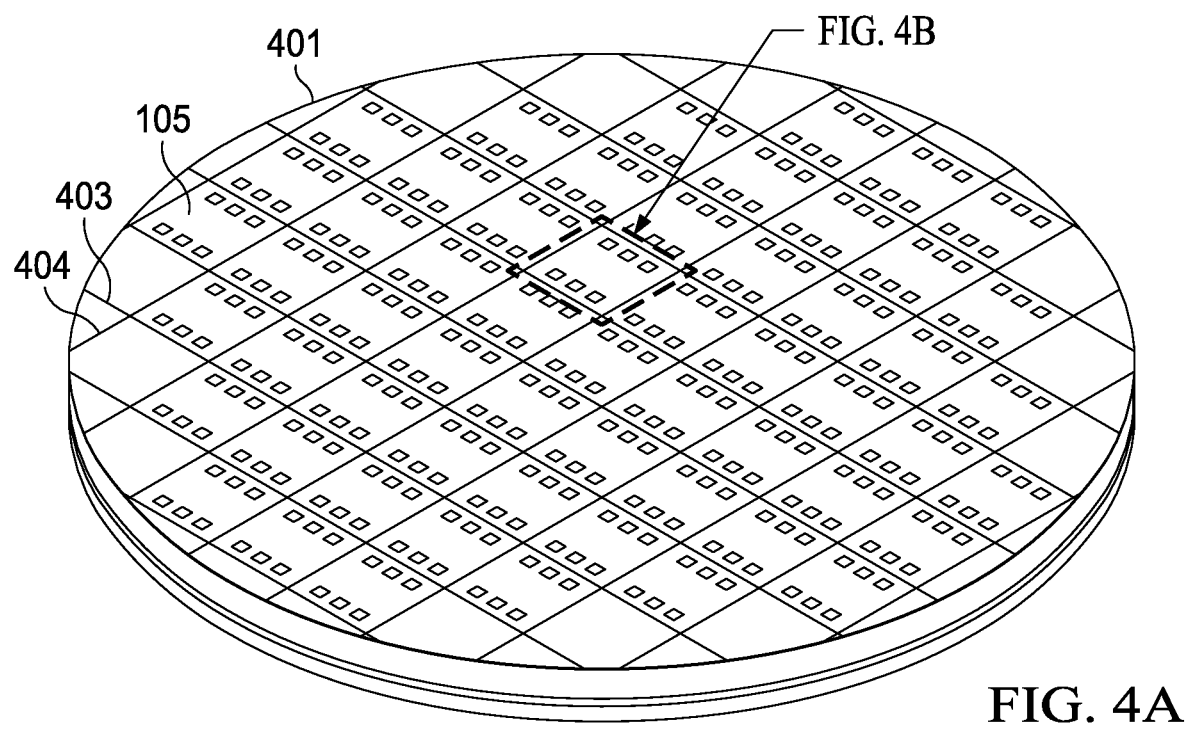
FIGS. 4A-4B illustrate in a projection view and a close up view, respectively, semiconductor dies on a semiconductor wafer and an individual semiconductor die.
Figure 4B:
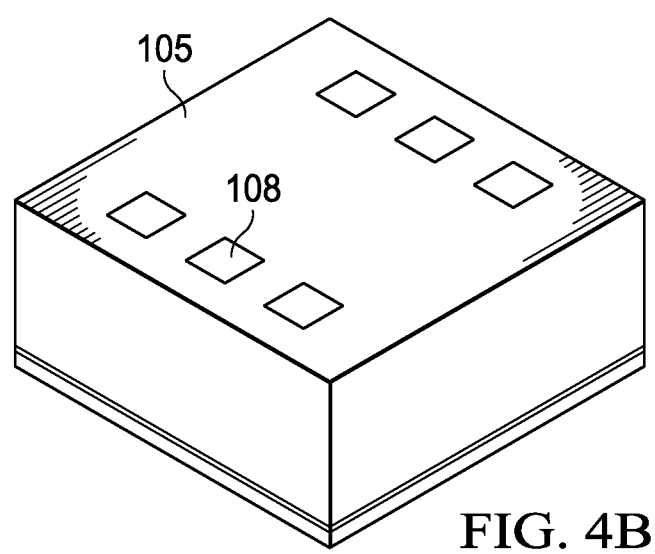

FIGS. 4A-4B illustrate steps used in forming semiconductor dies for wire bonding. In FIG. 4A, a semiconductor wafer 401 is shown with an array of semiconductor dies 105 arranged in rows and columns. The semiconductor dies 105 are formed using manufacturing processes in a semiconductor manufacturing facility, including ion implantation for carrier doping, anneals, oxidation, dielectric and conductor deposition, photolithography, pattern, etch, chemical mechanical polishing (CMP), electroplating, and other processes for making semiconductor devices. Devices are formed on a device side surface of the semiconductor dies. Scribe lanes 403 and 404, which are perpendicular to one another and which run in parallel groups across the wafer 401, separate the rows and columns of the completed semiconductor dies 105, and provide areas for dicing the wafer to separate the semiconductor dies 105 from one another.

FIG. 4B illustrates a single semiconductor die 105, with bond pads 108, which are conductive pads that are electrically coupled to devices (not shown for simplicity) formed in the semiconductor dies 105. The semiconductor dies 105 are separated from wafer 401 by wafer dicing, or are singulated from one another, using the scribe lanes 403, 404 (see FIG. 4A). Wafer dicing can be done by a mechanical saw or by laser cutting along the scribe lanes.

FIGS. 5A-5E show, in a series of cross sectional views, a process for packaging semiconductor dies 105 to form arrangements.

Figure 5D:
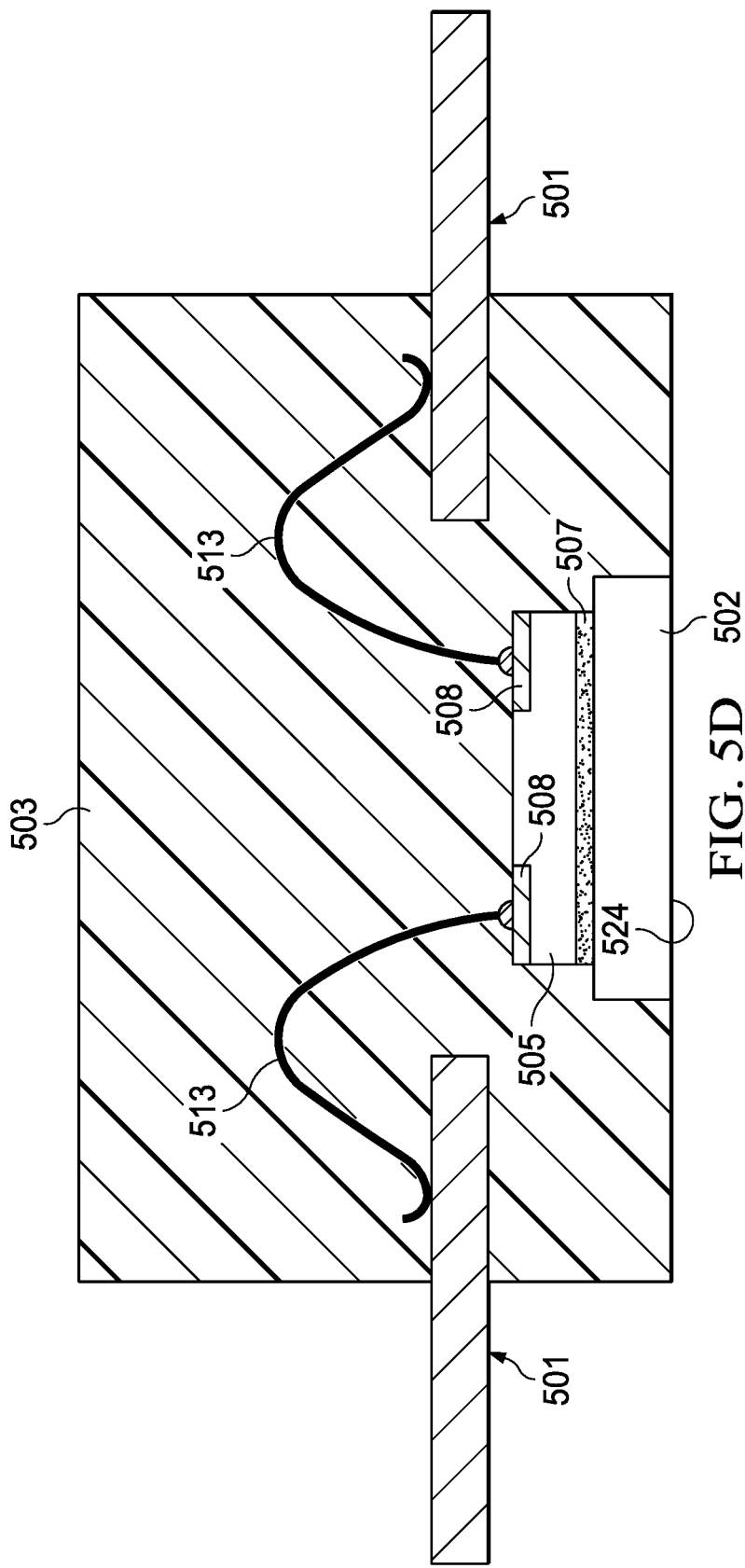

In FIG. 5A, a package substrate 509, in this example a metal lead frame, is shown in a cross section with leads 501 arranged with an upper surface 511 lying in a first plane P1. As the elements are oriented in FIG. 5A, plane P1 is a horizontal plane. The leads 501 are arranged with ends 525 placed near a die pad 502. Leads 501 are arranged on either side of die pad 502, near opposing sides of die pad 502. Die pad 502 is arranged in another horizontal plane P3 that is spaced from and parallel to plane P1. The leads 501 of the package substrate have upper surface 511 facing upwards (as oriented in FIGS. 5A-5E) and an opposite board side surface 523 facing downwards. The die pad 502 has a die side surface 521 that is in another horizontal plane P3, which is spaced downwards from plane P1 (as the elements are oriented in FIGS. 5A-5E), and the package substrate 509 can be referred to as a "downset" lead frame.

In forming package substrate 509, a flat sheet of conductor material is first patterned to form an array of unit lead frames with leads and die pads, with tie bars and dam bar portions connecting the leads and die pad elements to provide mechanical support during processing. The tie bars and dam bars will be removed or trimmed from the finished packaged devices after molding and sawing. In an example a copper sheet material is used. The flat sheet of conductor material can be stamped, punched, or etched to form the patterns. Half etched lead frames can be formed by etching separately from both sides of the flat material using different patterns. The flat sheet of conductor material is then shaped in metal shaping tools to form downsets, by pushing on portions of the flat sheet and forming angular supports that extend downwards from the horizontal plane P1. In the example arrangements a dual downset is used to place the die pad 502 in plane P3. A first downset operation places the die pad 502 in an intermediate plane (not shown in FIG. 5A) and another downset operation forms angular die pad straps (described further below) extending from a die pad support bar and places die pad 502 in the plane P3. The die pad 502 is positioned so that the backside surface 524 of die pad 502 can later be exposed from a molded package body to form a thermal dissipation path.

FIG. 5B illustrates the package substrate 509 of FIG. 5A after additional processing. In FIG. 5B, a semiconductor die 505 is shown attached to the die side surface 521 of the die pad 502 by a die attach material 507. The die attach material 507 can be a paste or epoxy, or can be a die attach film, and can be electrically conductive or electrically non-conductive, depending on the application. The die attach material 507 is a thermal conductor and provides thermal dissipation from the semiconductor die 505 to the die pad 502. The die pad 502 lies in a plane P3 that is beneath and parallel to plane P1 that the leads 501 lie in (as oriented in FIG. 5B). The backside surface 524 of the die pad 502 faces downward (as the elements are arranged in FIG. 5B.)

FIG. 5C illustrates the elements shown in FIG. 5B after additional processing. In FIG. 5C. bond wires 513 are formed to couple bond pads 508 on the device side surface of semiconductor die 505 to the upper surface 511 of leads 501. In some examples, multiple bond wires can couple to a single lead 501 to carry higher current signals or voltage supply lines. Die pad 502 is shown in plane P3 lying beneath the plane P1, the plane that the leads 501 lie in, with a backside surface 524 and die side surface 521.

FIG. 5D illustrates in another cross sectional view the elements of FIG. 5C after additional processing. In FIG. 5D, mold compound 503 is shown formed over the semiconductor die 505, the bond wires 513, and the die side surface 521 of die pad 502, while the backside surface 524 of die pad 502 is exposed from mold compound 503. The portions of leads 501 closest to the die pad 502 are covered with the mold compound 503 and the leads 501 extend through the mold compound 503 to form terminals for the packaged device. In additional process steps, the exposed portions of leads 501 will be shaped to form terminals with surface mount portions for mounting to a system board. Gull wing shapes can be used for the leads 501, for example. J-lead and DIP shaped leads can be formed.

Mold compound 503 can be formed in a transfer molding operation. A mold tool has unit mold areas and receives the package substrate with the semiconductor dies mounted to it in the mold tool. A thermoset molding compound can be used, such as an epoxy resin mold compound. The mold compound can have filler particles to enhance strength and thermal performance. The mold compound can be provided as a solid or powder material. In an example process, thermoset mold compound is heated to a liquid state and then forced into runners that transfer the mold compound into the molds, covering the semiconductor dies and portions of the lead frames with mold compound. As the mold compound cools it cures into a solid package body for each semiconductor device package for the semiconductor dies. Alternative mold compounds such as resins, epoxies, and plastics can be used.

Figure 5E:
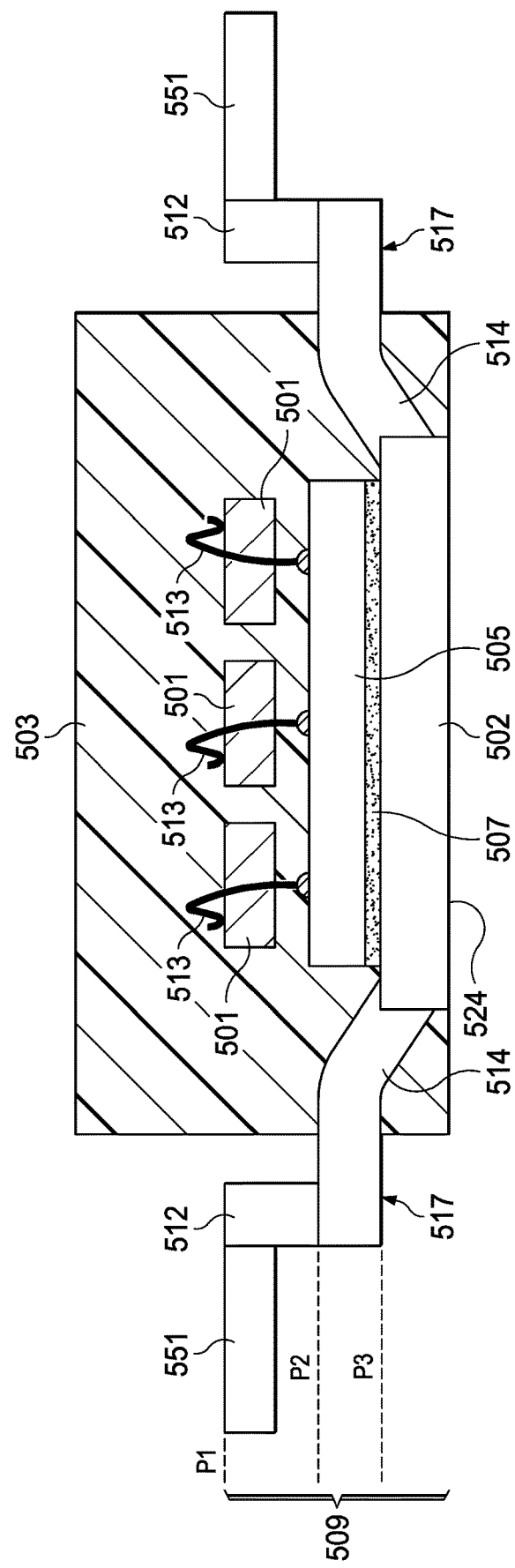

FIG. 5E illustrates the elements of FIG. 5D in another cross section and illustrates additional features of the arrangements. FIG. 5E is a cross sectional view of the package substrate 509 taken along the length of the die pad 502, and perpendicular to the cross sections of FIG. 5A-5D. FIG. 5E illustrates certain dual downset features of package substrate 509.

In FIG. 5E, the package substrate 509 includes a tie bar support 511 that lies in the plane P1 along with the leads 501. A first downset support 512 extends from the tie bar support 511 and has an angled portion that bends downwards to a die pad support bar 517. Die pad support bar 517 is in second plane P2 that lies beneath and is parallel to plane P1. A die pad strap 514, which can be a single strap, a pair of straps or several straps in varying arrangements, is shown extending from and then angled downwards from die pad support 517 and connected to die pad 502, which lies in the lowest plane, plane P3, which is spaced from and parallel to plane P2, in the direction away from plane P1. Use of the die pad support bar 517 and the die pad straps 514 allows a deep downset feature, so that the backside surface 524 of the die pad 502 is placed at the bottom of, and can be exposed from, the package formed by mold compound 503, and the exposed surface 524 is available for solder mounting to a system board. The exposed backside surface 524 of the die pad 502 increases thermal dissipation. The first downset strap 512, the tie bar 511 and the die pad support bar 517 are later removed in a device singulation process as is described below, as these portions of the package substrate 509 lie outside of the package body formed by mold compound 503, and are not part of the completed semiconductor device package. These portions form the first of two downsets, and help make the deep downset position of die pad 502 in the completed package possible. By forming die pads strap or straps 514 at the ends of the die pad 502, and positioning the leads 501 along the sides of die pad 502, a narrow package body with a deep downset die pad position is made possible. SOT packages, for example, that are made including the arrangements are less than 2 millimeters wide. In an example for an SOT package, die pad straps 514 are placed on the ends of the narrow die pad 502, which is less than or equal to 1 millimeters wide in some example arrangements. By use of end positions for the die pad straps, the narrow package body shape can accommodate the deep downset position die pad 502 with the exposed backside surface 524.

Figure 5F:
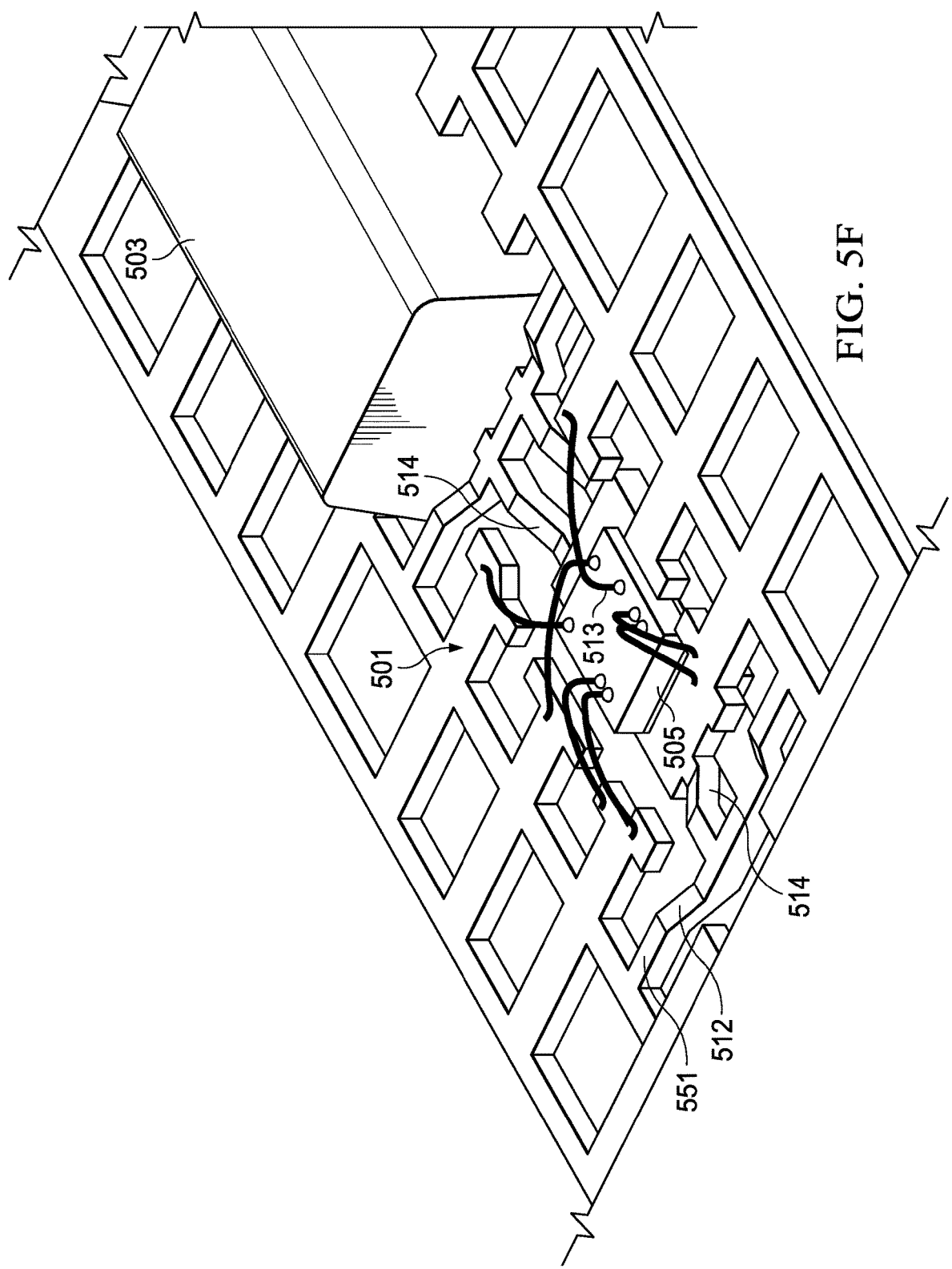

FIG. 5F is a projection view of a portion package substrate 509, used in an arrangement, here illustrated after a molding step. A strip of unit lead frames is shown, with one semiconductor device 505 exposed from mold compound 503 for clarity of illustration. In a production device, the package substrate 509 will have many strips of lead frames in a two dimensional array of rows and columns. Wire bonds 513 are shown coupling the bond pads of semiconductor die 502 to the upper surface of leads 501. Tie bar support 511, and tie bar angled portion 512, are shown with die pad support bar 517 formed beneath the tie bar support 511 and leads 501. Die pad straps 514 have a first portion that extend from the die pad support bar 517 have angled portions extending downwards from the die pad support 517 to die pad 502. The die pad 502 is at the lowest plane P3 (as shown in FIG. 5E), while the die pad support 517 is at a plane P2 above the plane P3 and below the plane P1 (again see FIG. 5E). The die pad straps 514 will be covered with mold compound and form part of the semiconductor device package, providing mechanical support to die pad 502, while the die pad support bar 517, the tie bar 511, and the tie bar angled portion 512 will not be covered with mold compound. The tie bar 511, the tie bar angled portion 512, and the die pad support 517 are removed when the packaged devices are removed from the package substrate 509.

Figure 6A:
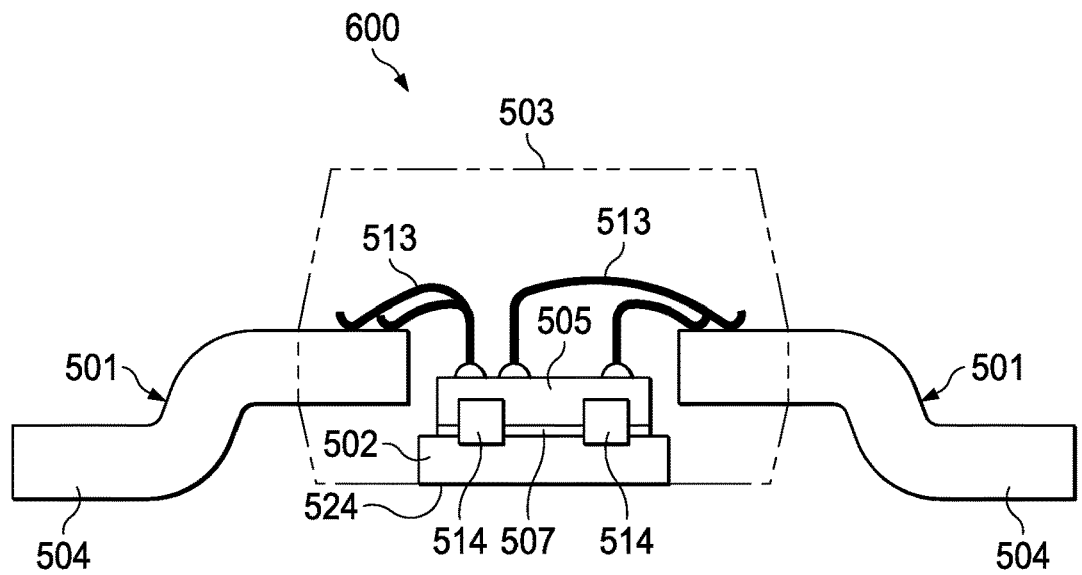
FIGS. 6A-6B illustrate, in an end view and a projection view from a bottom surface, packaged semiconductor devices of the arrangements.
Figure 6B:
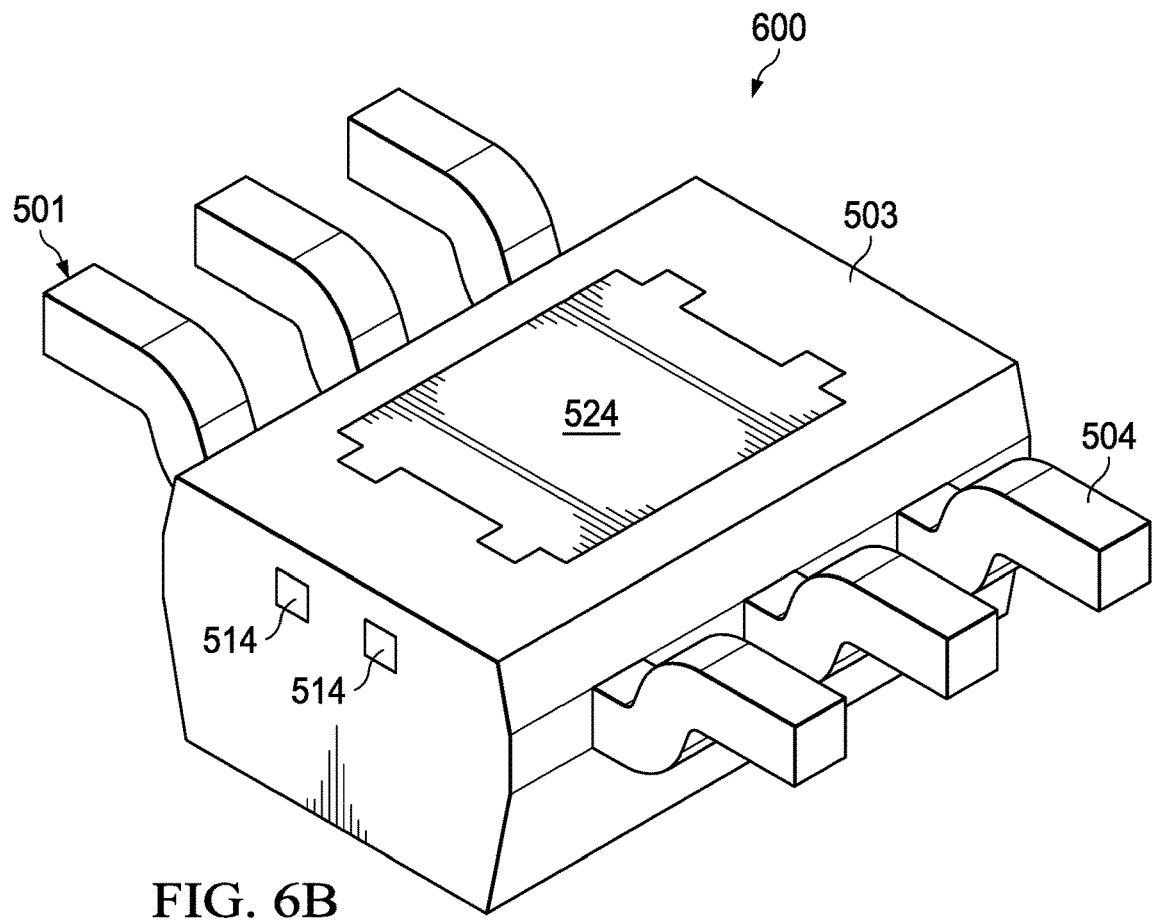

FIGS. 6A-6B illustrate, in an end view and a projection view, respectively, a packaged semiconductor device 600 which includes the arrangements. In FIG. 6A, the semiconductor device 600 is shown in an end view with mold compound 503 covering portions of the leads 501, wire bonds 513, semiconductor die 505, and die pad 502. The mold compound 503 is shown partially transparent for purposes of illustration. The ends of the die pad straps 514 are shown in the end view, in an example process for making an arrangement, the ends of the die pad straps 514 will be exposed from the mold compound 503. The backside surface 524 of the die pad 502 is exposed from the mold compound 503, and can be soldered or adhered to a system board for thermal dissipation. The leads 501 form terminals that have feet portions 504 arranged for surface mounting to a circuit board.

FIG. 6B illustrates the packaged semiconductor device 600, in a projection view with the board side surface shown. The backside surface 524 of the die pad is shown exposed from the mold compound 503. The ends of die pad straps 514 are shown exposed from the mold compound 503 at the ends of the packaged semiconductor device 600. Leads 501 are shown on the two opposing sides of the semiconductor device package 600, and the leads are shown after a trim and form process shapes the leads into terminals with gull wing shapes, with feet portions 504 for surface mounting to a circuit board.

Figure 7:
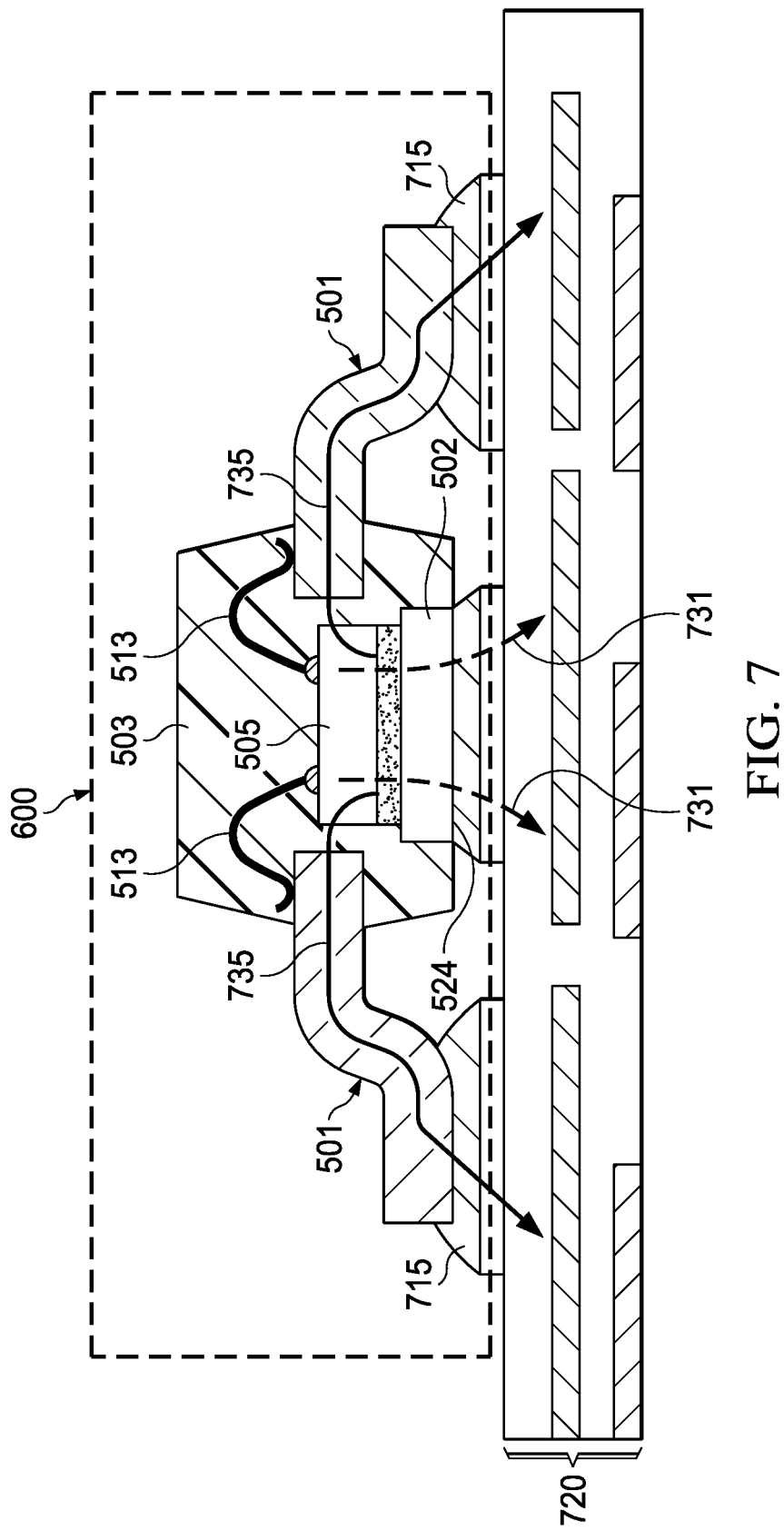
FIG. 7 illustrates, in a cross sectional view, a packaged semiconductor device of an arrangement mounted to a circuit board.

FIG. 7 illustrates in another cross section the packaged semiconductor device 600 shown in FIGS. 6A-6B surface mounted to a circuit board 720. In FIG. 7, the packaged semiconductor device 600 is shown soldered to conductive lands 717 on the circuit board 720 by solder joints 715. The die pad 502 has backside surface 524, which is exposed from the mold compound 503, soldered to a thermal pad 718 on circuit board 720. In an alternative, a thermally conductive adhesive or tape can be used instead of solder between the backside surface 524 of die pad 502 and the thermal pad 718, the surfaces are thermally coupled. The thermal pad 718 can, in some arrangements, carry a voltage such as ground, or can be used for thermal connection without a voltage. The arrows 731 illustrate the thermal path from the semiconductor die 505 to die pad 502 and into the circuit board 720. Arrows 735 illustrate some additional thermal dissipation from leads 501. Because the packaged semiconductor devices of the arrangements have the semiconductor die mounted to a deep downset die pad 502 with the exposed backside surface 524 which can be soldered or otherwise coupled to the circuit board 720, the thermal dissipation can be into the circuit board 720 from the semiconductor die 505 through the die pad 502, and this increases the thermal performance of the package greatly when compared to semiconductor device packages formed without use of the arrangements.

Figure 8:
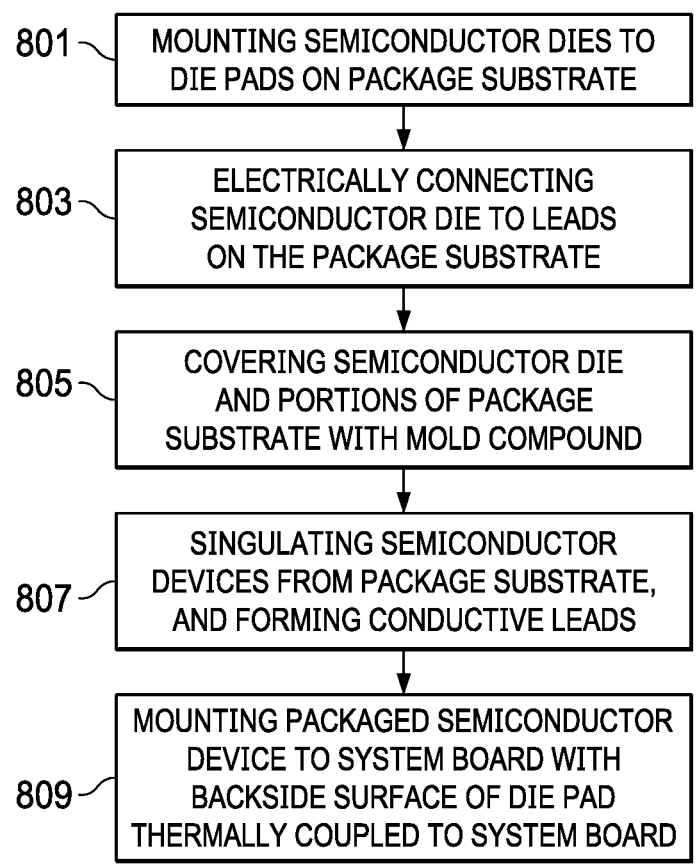
FIG. 8 illustrates in a flow diagram selected steps of a method for forming the arrangements.

FIG. 8 illustrates, in a flow diagram, steps for forming a semiconductor device package of the arrangements. In the flow diagram, processing for a single semiconductor die is described for explanation. In a production run, the package substrate will have many semiconductor dies mounted to unit lead frame portions, the wire bonding and molding operations are performed on all of the unit devices contemporaneously to increase yield and reduce costs of manufacturing.

At step 801, a semiconductor die is mounted to the die side surface of a die pad on a package substrate (see, for example, semiconductor dies 505 in FIG. 5B). The semiconductor die is mounted with a device side surface facing away from the die pad. The package substrate can include a strip or array of conductive lead frame portions for individual units.

At step 803, electrical connections are formed between leads on the package substrate and bond pads on the semiconductor die. Wire bonds or ribbon bonds can form the electrical connections (see, for example, bond wires 513 in FIG. 5C).

At step 805, mold compound is used to cover the semiconductor die, portions of the leads of the package substrate, and portions of the die pad, while a backside surface of the die pad remains exposed from the mold. The die pad is downset so that the backside surface of the die pad is exposed at the bottom of the molded package. (See, for example, mold compound 503 and backside surface 524 in FIG. 5D).

At step 807, the packaged semiconductor device is separated from the package substrate by sawing through saw streets between the packaged semiconductor devices. Excess material is trimmed from the leads and the packages, and the leads are formed to provide terminals with surface mount portions. (See, for example, the packaged semiconductor device 600 in FIGS. 6A-6B)

At step 809, a packaged semiconductor device is mounted to a circuit board or module using solder, for example a surface mount technology (SMT) process can be used with a solder reflow. A solder joint is formed between the terminals of the semiconductor device package, and the backside surface of the die pad is thermally coupled to the circuit board. (See FIG. 7, semiconductor package 600 and circuit board 720). Thermal dissipation from the semiconductor die in the semiconductor device package is directed through the exposed backside surface of the die pad and into the system board. Use of the arrangements increases thermal performance, which in turn increases performance of the packaged semiconductor devices.

The use of the arrangements provides a packaged semiconductor device with enhanced thermal dissipation, without changes to the design of the semiconductor die, while using existing lead and package body sizes. The arrangements are formed using existing methods, materials and tooling for making the devices and are cost effective. By providing a deep downset die pad that is compatible with a narrow package body types, the thermal performance of SOT packages and other narrow body semiconductor device packages can be enhanced with use of the arrangements. Although SOT packages are the examples shown in the illustrations, other package types can be used with the arrangements.

Modifications are possible in the described arrangements, and other alternative arrangements are possible within the scope of the claims.

What is claimed is:

1. An apparatus, comprising:
 a package substrate having a die pad with a die side surface and having an opposite backside surface, the package substrate having leads spaced from the die pad arranged along two opposite sides of the die pad, and having die pad straps extending from two opposing ends of the die pad, the leads lying in a first plane, first portions of the die pad straps lying in a second plane that is spaced from and parallel to the first plane and located closer to the die pad than the first plane, and the die pad straps having angled portions extending from the first portions to the die pad, the die pad lying in a third plane that is spaced from and parallel to the second plane in a direction away from the first plane;
 a semiconductor die mounted to the die side surface of the die pad, the semiconductor die having bond pads on a device side surface facing away from the die pad;
 electrical connections coupling the bond pads of the semiconductor die to the leads of the package substrate; and
 mold compound covering the semiconductor die, the electrical connections, a portion of the leads, and the die side surface of the die pad, and the backside surface of the die pad, and ends of the first portions of the die pad straps exposed from the mold compound.

2. The apparatus of claim 1, the leads having portions extending from the mold compound to form terminals.

3. The apparatus of claim 2, wherein the leads are shaped outside the mold compound to extend alongside a package body formed by the mold compound to form the terminals, the terminals having feet portions configured for surface mounting to a circuit board.

4. The apparatus of claim 1, wherein the backside surface of the die pad is configured for surface mounting to a circuit board.

5. The apparatus of claim 1, wherein the electrical connections comprise wire bonds or ribbon bonds.

6. The apparatus of claim 1, wherein the package substrate is a metal lead frame.

7. The apparatus of claim 6, wherein the metal lead frame comprises copper, stainless steel, steel, alloy 42, or alloys thereof.

8. The apparatus of claim 1, wherein the first portions of the die pad straps have ends exposed from the mold compound.

9. The apparatus of claim 1, wherein the mold compound forms a package body with a width less than 2 millimeters.

10. The apparatus of claim 1, wherein the die pad has a width less than 1 millimeter.

11. The apparatus of claim 1, wherein the mold compound forms a package body that, with the leads, comprises a small outline transistor (SOT) package.

12. An apparatus, comprising:
a packaged semiconductor device that is surface mountable to a circuit board and having conductive terminals with feet portions and having a die pad with an exposed backside surface, the backside surface of the die pad thermally configured to be coupled to the circuit board;
wherein the packaged semiconductor device further comprises:
a die pad having a die side surface and having an opposite backside surface, leads spaced from the die pad arranged along two opposite sides of the die pad and die pad straps extending from two opposing ends of the die pad, the leads lying in a first plane, the die pad straps having first portions lying in a second plane that is spaced from and parallel to the first plane and located closer to the die pad than the first plane, and the die pad lying in a third plane that is spaced from and parallel to the second plane in a direction away from the first plane;
a semiconductor die mounted to the die side surface of the die pad, the semiconductor die having bond pads on a device side surface facing away from the die pad;
bond wires coupling the bond pads and the leads; and
mold compound covering the semiconductor die, the bond wires, a portion of the leads, and the die side surface of the die pad, the backside surface of the die pad, and ends of the first portions of the die pad straps exposed from the mold compound.

13. The apparatus of claim 12, wherein the backside surface of the die pad is solderable to the circuit board.

14. The apparatus of claim 12, wherein the backside surface of the die pad is configured to be thermally coupled to a thermal pad on the circuit board by a tape, adhesive, paste, epoxy or solder.

15. The apparatus of claim 12, wherein the packaged semiconductor device is a leaded package, and the leads extend away from the mold compound forming the conductive terminals.

16. The apparatus of claim 15, wherein the leaded package is a small outline transistor (SOT) package.

17. A method, comprising:
mounting a semiconductor die to a die side surface of a die pad of a package substrate, the package substrate having leads arranged on opposite sides of the die pad and having die pad straps coupled to opposing ends of the die pad, the leads in a first plane, the die pad straps having first portions in a second plane that is spaced from and parallel to the first plane in a direction towards the die pad, and having angled portions extending from the first portion to the die pad, and the die pad in a third plane that is spaced from and parallel to the second plane and in a direction away from the first plane, the die pad having a backside surface opposite the die side surface;
forming electrical connections coupling bond pads on a device side surface of the semiconductor die to the leads;
covering the semiconductor die, the die side surface of the die pad, and the electrical connections with mold compound to form a packaged semiconductor device, the leads having portions extending from the mold compound to form terminals, the backside surface of the die pad exposed from the mold compound;
separating the packaged semiconductor device from the remaining portions of the package substrate such that ends of the first portions of the die pad straps are exposed from the mold compound; and
forming the leads outside the mold compound to shape the terminals for surface mounting the packaged semiconductor device.

18. The method of claim 17, and further comprising:
using the terminals, mounting the packaged semiconductor device to a circuit board, and thermally coupling the backside surface of the die pad to the circuit board.

19. The method of claim 18, wherein mounting the packaged semiconductor device comprises soldering the terminals to conductive lands on the circuit board, and thermally coupling the backside surface of the die pad to a thermal pad on the circuit board.

20. The method of claim 19, wherein thermally coupling the backside surface of the die pad to a thermal pad on the circuit board further comprises soldering the backside surface of the die pad to the thermal pad on the circuit board.

* * * * *